US011245091B2

(12) United States Patent
Xiao et al.

(10) Patent No.: US 11,245,091 B2
(45) Date of Patent: Feb. 8, 2022

(54) OLED PANEL HAVING OLED ELEMENT SEALED THEREIN, OLED PACKAGING METHOD FOR SEALING OLED ELEMENT, AND DISPLAY PANEL

(71) Applicants: BOE Technology Group Co., Ltd., Beijing (CN); Ordos Yuansheng Optoelectronics Co., Ltd., Inner Mongolia (CN)

(72) Inventors: Ang Xiao, Beijing (CN); Xiaodong Yang, Beijing (CN); Guowei Li, Beijing (CN); Quanqin Sun, Beijing (CN); Yangyang Zhang, Beijing (CN); Hongjian Wu, Beijing (CN); Chao Ma, Beijing (CN); Guanyu Lu, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 229 days.

(21) Appl. No.: 16/089,804

(22) PCT Filed: Sep. 22, 2017

(86) PCT No.: PCT/CN2017/102989
§ 371 (c)(1),
(2) Date: Sep. 28, 2018

(87) PCT Pub. No.: WO2018/192169
PCT Pub. Date: Oct. 25, 2018

(65) Prior Publication Data
US 2020/0203657 A1 Jun. 25, 2020

(30) Foreign Application Priority Data
Apr. 19, 2017 (CN) .......................... 201710257928.1

(51) Int. Cl.
*H01L 51/52* (2006.01)
*H01L 51/56* (2006.01)

(52) U.S. Cl.
CPC ...... *H01L 51/5246* (2013.01); *H01L 51/5253* (2013.01); *H01L 51/56* (2013.01)

(58) Field of Classification Search
CPC .............. H01L 51/5237; H01L 51/524; H01L 51/5246; H01L 51/525; H01L 51/5253; H01L 51/5256
See application file for complete search history.

(56) References Cited

U.S. PATENT DOCUMENTS

2004/0046184 A1*  3/2004  Yanagawa .............. H01L 27/322
                                                          257/200
2005/0045900 A1*  3/2005  Silvernail ........... H01L 51/5256
                                                          257/99
(Continued)

FOREIGN PATENT DOCUMENTS

CN        101867023 A       10/2010
CN        103346268 A       10/2013
(Continued)

OTHER PUBLICATIONS

English translation of International Search Report and Box V of Written Opinion for International Application No. PCT/CN2017/102989, dated Jan. 19, 2018, 6 pages.
(Continued)

*Primary Examiner* — Jesse Y Miyoshi
(74) *Attorney, Agent, or Firm* — Westman, Champlin & Koehler, P.A.

(57) ABSTRACT

The present disclosure provides an OLED panel, an OLED packaging method, and a display panel. The OLED panel includes a substrate; an OLED element on a surface of the substrate; an inorganic cover layer on the substrate and the OLED element, the inorganic cover layer being configured
(Continued)

to cover a peripheral portion of the surface of the substrate; a bonding layer on the inorganic cover layer; and a barrier layer on the bonding layer, wherein a portion of the bonding layer on the peripheral portion includes at least one rib configured to form an airtight space for isolating the OLED element from the external.

16 Claims, 4 Drawing Sheets

(56) References Cited

U.S. PATENT DOCUMENTS

| | | | | |
|---|---|---|---|---|
| 2008/0050585 | A1* | 2/2008 | Masuda | H01L 51/525 |
| | | | | 428/354 |
| 2009/0115325 | A1* | 5/2009 | Matsuzaki | H01L 51/5256 |
| | | | | 313/504 |
| 2009/0261719 | A1* | 10/2009 | Nimura | H01L 51/5246 |
| | | | | 313/504 |
| 2013/0048967 | A1* | 2/2013 | Nishido | H05B 33/04 |
| | | | | 257/40 |
| 2014/0217371 | A1* | 8/2014 | Kim | H01L 51/5256 |
| | | | | 257/40 |
| 2017/0077444 | A1 | 3/2017 | Yamazaki et al. | |

FOREIGN PATENT DOCUMENTS

| | | |
|---|---|---|
| CN | 104538558 A | 4/2015 |
| CN | 106206959 A | 12/2016 |
| CN | 107068905 A | 8/2017 |

OTHER PUBLICATIONS

First Office Action, including Search Report, for Chinese Patent Application No. 201710257928.1, dated Feb. 14, 2018, 14 pages.

* cited by examiner

OLED PANEL HAVING OLED ELEMENT SEALED THEREIN, OLED PACKAGING METHOD FOR SEALING OLED ELEMENT, AND DISPLAY PANEL

CROSS-REFERENCE TO RELATED APPLICATION(S)

This application is a US National Stage Application of PCT Application No. PCT/CN2017/102989, filed on Sep. 22, 2017, entitled "OLED PACKAGE STRUCTURE, OLED PACKAGING METHOD, AND DISPLAY PANEL", which claims priority to the Chinese Patent Application No. 201710257928.1, filed on Apr. 19, 2017, entitled "OLED PACKAGE STRUCTURE, OLED PACKAGING METHOD, AND DISPLAY PANEL", both of which are incorporated herein by reference in their entireties.

TECHNICAL FIELD

The present disclosure relates to the field of semiconductor packaging, and more particularly, to an OLED panel, an OLED packaging method, and a display panel.

BACKGROUND

Organic Light-Emitting Diodes (OLEDs) are display lighting devices which have received increasing attention in recent years, and their characteristics of being able to realize flexible displays are particularly favored by people. However, as OLED devices are damaged by corrosion under the action of moisture and oxygen, the OLED devices currently need to be protected by a display panel. In order to ensure the flexibility of an OLED, the OLED is generally packaged using a thin film packaging technology. However, the thin film packaging technology in the related art requires a variety of different packaging devices, which generally have an expensive cost and require a complicated and lengthy process.

SUMMARY

The present disclosure proposes an OLED panel, an OLED packaging method, and a display panel.

According to an aspect of the present disclosure, there is proposed an OLED panel. The OLED panel comprises: a substrate; an OLED element on a surface of the substrate; an inorganic cover layer on the substrate and the OLED element, the inorganic cover layer being configured to cover a peripheral portion of the surface of the substrate; a bonding layer on the inorganic cover layer; and a barrier layer on the bonding layer. A portion of the bonding layer on the peripheral portion comprises at least one rib configured to form an airtight space for isolating the OLED element from the external.

In an embodiment, the at least one rib is located between the inorganic cover layer and the barrier layer.

In an embodiment, the at least one rib is located between the substrate and the barrier layer.

In an embodiment, the airtight space is filled with inert gas or nitrogen gas.

In an embodiment, a portion of the inorganic cover layer on the peripheral portion has at least one channel. The at least one channel corresponds to the at least one rib in the bonding layer, and the at least one rib is inserted into the corresponding channel, so that an end of each of the at least one rib is in contact with the bottom of the channel.

In an embodiment, the bottom of the channel is the substrate.

In an embodiment, the OLED panel further comprises: an edge sealant. The edge sealant is between an edge of the inorganic cover layer and an edge of the barrier layer and outside the bonding layer.

In an embodiment, the peripheral portion is a rectangular loop-shaped structure located at the periphery of the substrate.

According to another aspect of the present disclosure, there is proposed an OLED packaging method. The OLED packaging method comprises: forming an OLED element on a surface of a substrate; forming an inorganic cover layer on the substrate and the OLED element, so that a peripheral portion of the surface of the substrate is covered by the inorganic cover layer; and forming a barrier layer on the inorganic cover layer with a bonding layer interposed therebetween. A portion of the bonding layer on the peripheral portion comprises at least one rib configured to form an airtight space for isolating the OLED element from the external.

In an embodiment, the at least one rib is formed between the inorganic cover layer and the barrier layer.

In an embodiment, the at least one rib is formed between the substrate and the barrier layer.

In an embodiment, the airtight space is filled with inert gas or nitrogen gas.

In an embodiment, the forming of an inorganic cover layer on the substrate and the OLED element further comprises: forming at least one channel in a portion of the inorganic cover layer on the peripheral portion. The at least one channel corresponds to the at least one rib in the bonding layer, and the at least one rib is inserted into the corresponding channel so that an end of each of the at least one rib is in contact with the bottom of the corresponding channel.

In an embodiment, the at least one channel passes through the inorganic cover layer, so that the bottom of the at least one channel is the substrate.

In an embodiment, the OLED packaging method further comprises: disposing an edge sealant between an edge of the inorganic cover layer and an edge of the barrier layer, so that the edge sealant is located outside the bonding layer.

In an embodiment, the peripheral portion is a rectangular loop-shaped structure located at the periphery of the substrate.

In an embodiment, the forming of a barrier layer on the inorganic cover layer with a bonding layer interposed therebetween comprises: forming a bonding layer on a surface of the barrier layer; and bonding the bonding layer to the inorganic cover layer and/or the substrate.

According to yet another aspect of the present disclosure, there is proposed a display panel. The display panel comprises the OLED panel according to any of the embodiments described above.

BRIEF DESCRIPTION OF THE ACCOMPANYING DRAWINGS

The above and other purposes, features and advantages of the present disclosure will be more apparent from the following description of the preferred embodiments of the present disclosure with reference to the accompanying drawings, in which.

DETAILED DESCRIPTION

Specific embodiments of the present disclosure will be described in detail below. It should be illustrated that the embodiments described here are illustrated merely by way of example instead of limiting the present disclosure. In the following description, numerous specific details are set forth to provide a more thorough understanding of the present disclosure. However, it will be obvious to those skilled in the art that the present disclosure may be practiced without these specific details. In other instances, well-known circuits, materials or methods are not described in detail in order to avoid obscuring the present disclosure.

Reference throughout this specification to "an embodiment", "an embodiment", "one example" or "an example" means that a particular feature, structure, or characteristic described in connection with the embodiment or example is included in at least an embodiment of the present invention. Thus, the appearances of the phrase "in an embodiment", "in an embodiment", "one example" or "an example" in various places throughout this specification are not necessarily all referring to the same embodiment or example. Furthermore, the particular features, structures, or characteristics may be combined in any suitable combination and/or sub-combination in one or more embodiments or examples. In addition, it should be understand by those skilled in the art that the accompanying drawings provided herein are for the purpose of illustration, and are not necessarily drawn to scale. A term "and/or" used herein comprises any or all combinations of one or more listed related items.

The present disclosure will be specifically described below with reference to the accompanying drawings.

Figure 1:
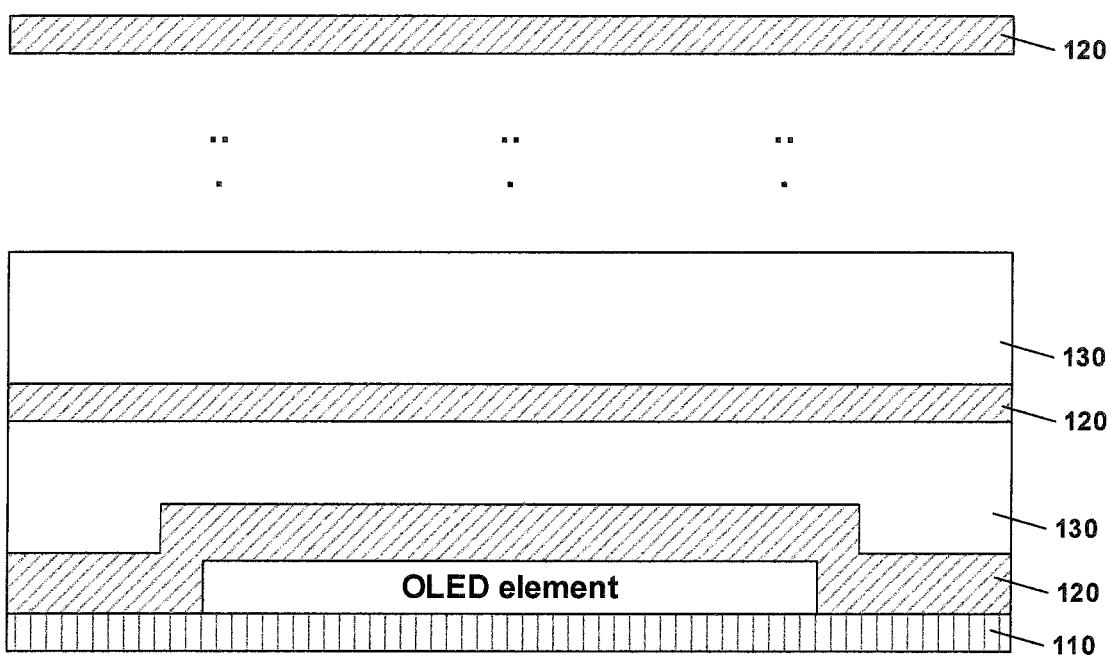
FIG. 1 illustrates an OLED panel.

Firstly, FIG. 1 illustrates an OLED panel 100 according to an embodiment of the present disclosure. As shown in FIG. 1, the OLED panel 100 comprises a substrate 110, a plurality of inorganic layers 120 and organic layers 130 which are stacked alternately in sequence from bottom to top. An OLED element to be packaged is disposed on the substrate 110. A first inorganic layer 120 disposed on the substrate 110 packages the OLED element on the substrate 110, and subsequent various organic layers 130 and inorganic layers 120 are stacked on the first inorganic layer 120 layer by layer, to further protect the packaged OLED element. In the OLED panel 100, the inorganic layers 120 are generally formed using a Plasma-Enhanced Chemical Vapor Deposition (PECVD) device, and have a material of, for example, but not limited to, SiNx, SiON, or a combination thereof. The organic layers 130 are generally formed using an evaporator, a printer, or an inkjet printing device, and may have a material of, for example, a polymerizable organic monomer, such as acrylic, epoxy, silicone, or a combination thereof. Thus, it needs to realize the OLED panel 100 using multiple devices in a relatively lengthy packaging process, which increases the production cost to some extent.

Figure 2:
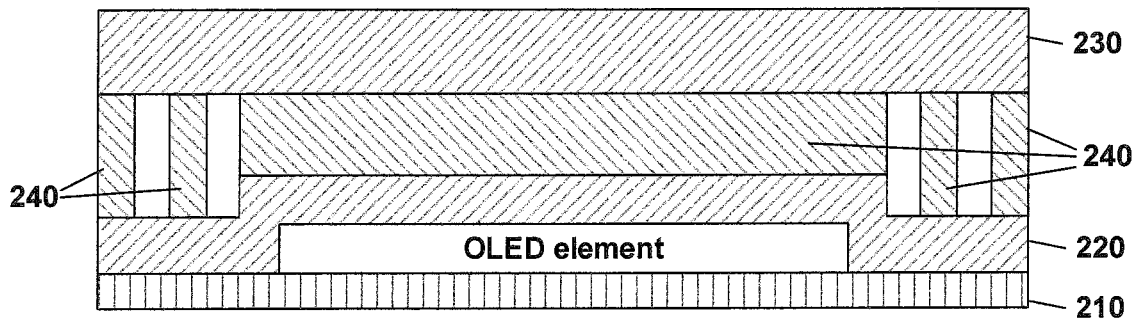
FIG. 2 illustrates an OLED panel according to an embodiment of the present disclosure.

FIG. 2 illustrates a cross-sectional view of an OLED panel 200 according to an embodiment of the present disclosure. As shown in FIG. 2, the OLED panel 200 comprises a substrate 210, an inorganic cover layer 220, a barrier layer 230, and a bonding layer 240.

An OLED element to be packaged is disposed on a surface of the substrate 210 (for example, an upper surface in FIG. 2). The surface of the substrate 210 may be exemplarily divided into a center region and a peripheral region. For example, the central region may correspond to a region where the OLED element is placed. As another example, the peripheral region may refer to a region within a certain distance from edges of the substrate 210. In an embodiment, the OLED element to be packaged is located in the central region. It should be illustrated that the introduction of the central region and the peripheral region is only for facilitating the description and illustration of the technical solutions of the present application, and does not impose any limitation on the structure involved in the present application. It should be understood by those skilled in the art that the present application does not need to define a boundary between the center region and the peripheral region, and those skilled in the art can adjust the boundary according to different requirements accordingly to facilitate the implementations of the technical solutions.

In an embodiment, the central region is rectangular in shape and the peripheral region is a rectangular loop in shape. In other embodiments, the central region and the peripheral region may also have other shapes as needed.

The OLED element on the substrate generally comprises an OLED light emitting unit layer, a driving array layer etc., and the structure thereof is not limited here.

The inorganic cover layer 220 is disposed on the substrate 210 and the OLED element. Specifically, the inorganic cover layer 220 covers the OLED element and allows a peripheral portion of the surface of the substrate 210 to be covered by the inorganic cover layer 220, that is, the OLED element is sealed between the inorganic cover layer 220 and the substrate 210.

The inorganic cover layer 220 serves as a basic water-oxygen barrier film layer, has a material of, for example, but not limited to, SiNx, SiON, or a combination thereof, and may be formed using a PECVD device.

In addition to the inorganic cover layer 220, the OLED panel 200 further comprises a barrier layer 230 for further blocking water and oxygen. The barrier layer 230 is disposed on the inorganic cover layer 220 with the bonding layer 240 interposed therebetween.

The barrier layer 230 may be implemented as a single film layer. For example, the barrier layer 230 may be an inorganic layer (formed using a PECVD device), which is the same as or similar to the inorganic cover layer 220, or may be an inorganic layer deposited by, for example, atomic layer deposition, sputter deposition, evaporation deposition, etc. using other devices. The barrier layer 230 may also be implemented as a multi-layer stack structure. The stack structure may be a stack of a plurality of inorganic layers, or may also be similar to the stack structure formed by alternatively stacking the organic layers and the inorganic layers in FIG. 1.

In an embodiment, the barrier layer 230 is flexible so as to be more suitable for packaging the OLED element.

The bonding layer 240 is composed of a plurality of portions including a central portion located above the central region and a peripheral portion on the peripheral portion of the surface of the substrate 210, and the peripheral portion of the bonding layer 240 comprises at least one rib. The at least one rib is located between the inorganic cover layer 220 and the barrier layer 230 and forms a plurality of airtight spaces together with the inorganic cover layer 220, the barrier layer 230, and the central portion of the bonding layer 240 (see a blank filled region located between the inorganic cover layer 220 and the barrier layer 230 in the structure in FIG. 2). The airtight spaces can be formed to more effectively isolate the OLED element from the invasion of water and oxygen. Thus, even if the bonding layer 240 per se has a weak water-oxygen proofing capability, the OLED element to be packaged can be well protected by the OLED panel 200.

It should be understood that only a cross-sectional view of the OLED panel 200 is shown in FIG. 2. In order to better proof surrounding water and oxygen, the at least one rib are realized as a rectangular loop-shaped structure.

It should be understood that although only two ribs on the left and two ribs on the right are shown in FIG. 2, in other embodiments of the present disclosure, the OLED panel 200 may comprise one or more ribs.

In an embodiment, the airtight spaces are filled with inert gas or nitrogen gas. In another embodiment, the airtight spaces are in a vacuum or quasi-vacuum state.

In order to realize the OLED panel shown in FIG. 2, only a PECVD system and a laminating machine need to be used, which can reduce the production cost and simplify the production process while maintaining the water-oxygen proofing capability of the display panel.

Figure 3:
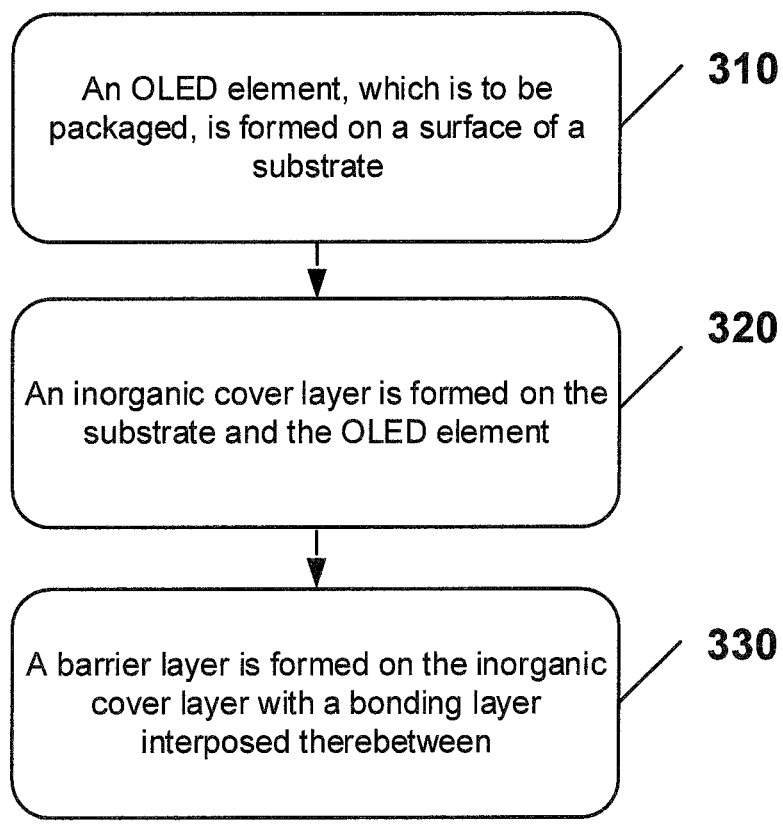
FIG. 3 illustrates a flowchart of an OLED packaging method according to an embodiment of the present disclosure.

FIG. 3 illustrates a flowchart of an OLED packaging method 300 corresponding to the OLED panel 200 shown in FIG. 2.

Firstly, in step 310, an OLED element, which is to be packaged, is formed on a surface of a substrate (for example, the substrate 210).

Then, in step 320, an inorganic cover layer (for example, the inorganic cover layer 220) is formed on the substrate and the OLED element, so that a peripheral portion of the surface is covered by the inorganic cover layer.

Finally, in step 330, a barrier layer (for example, the barrier layer 230) is formed on the inorganic cover layer with a bonding layer interposed therebetween (for example, the bonding layer 240), wherein a portion of the bonding layer on the peripheral portion comprises at least one rib, which is located between the inorganic cover layer and the barrier layer to form an airtight space between the inorganic cover layer and the barrier layer for isolating the OLED element from the external.

In an embodiment, the airtight space is filled with inert gas or nitrogen gas.

In an embodiment, in step 330, the bonding layer is firstly formed on a surface of the barrier layer, and then the bonding layer is bonded to the inorganic cover layer, so that the barrier layer is formed on the inorganic cover layer.

In another embodiment, in step 330, the bonding layer may also be firstly formed on the inorganic cover layer, and then the barrier layer is bonded to the bonding layer, so that the barrier layer is formed on the inorganic cover layer.

It should be illustrated that as the OLED panel 200 in FIG. 2 corresponds to the OLED packaging method 300 in FIG. 3, the explanation and illustration in the above description of the OLED panel 200 in conjunction with FIG. 2 is also applicable here, and the repeated parts will not be described in detail.

Figure 4:
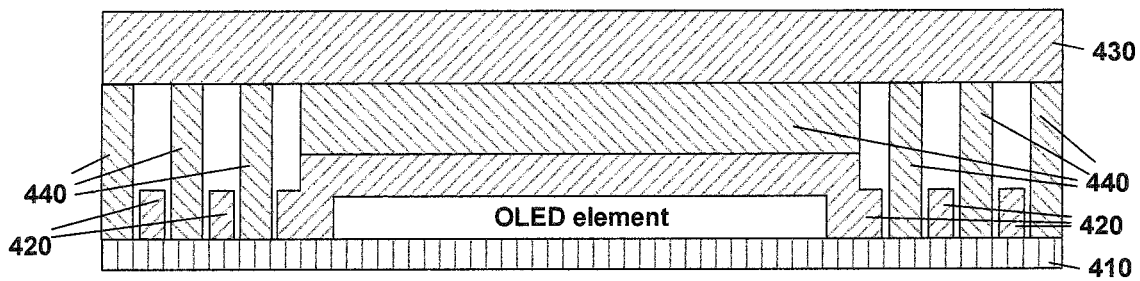
FIG. 4 illustrates an OLED panel according to another embodiment of the present disclosure.

FIG. 4 illustrates an OLED panel 400 according to another embodiment of the present disclosure.

As shown in FIG. 4, the OLED panel 400 comprises a substrate 410, an inorganic cover layer 420, a barrier layer 430, and a bonding layer 440. The OLED panel 400 differs from the OLED panel 200 in FIG. 2 in the structure of the inorganic cover layer and the bonding layer.

As shown in FIG. 4, in the OLED panel 400, a portion of the inorganic cover layer 420 on a peripheral portion of a surface of the substrate 410 has at least one channel. The at least one channel corresponds to the at least one rib in the bonding layer 440. The at least one rib is inserted into the corresponding channel, so that an end of each of the at least one rib is in contact with the bottom of the channel.

In FIG. 4, the at least one channel passes through the inorganic cover layer 420, so that the bottom of the at least one channel is the surface of the substrate 410. It should be understood that in other embodiments, one or more of the at least one channel may not pass through the inorganic cover layer 420.

In an embodiment, the at least one channel has a width equal to (or slightly greater than) that of the at least one rib, so that the at least one channel can be completely (or nearly completely) filled with the at least one rib.

It should be understood that although only three ribs on the left and three ribs on the right are shown in FIG. 4, in other embodiments of the present disclosure, the OLED panel 400 may comprise one or more ribs.

In addition, in the embodiment shown in FIG. 4, all of the at least one rib 440 are formed between the substrate 410 and the barrier layer 430, but the present disclosure is not limited thereto. In fact, in some other embodiments, similarly to the embodiment shown in FIG. 2, some of the at least one rib 440 may be formed between a portion of the inorganic cover layer 420 without a channel and the barrier layer 430. For example, in some embodiments, ribs 440 near the inner side may be formed between the portion of the inorganic cover layer 420 without a channel and the barrier layer 430, and ribs 440 near the outer side may be formed between the bottom of the channels of the inorganic cover layer 420 and the barrier layer 430. In some other embodiments, in a case where the channels pass through the inorganic cover layer 420, i.e., the bottom of the channels is the surface of the substrate 410, the ribs 440 near the outer side may be formed between the substrate 410 and the barrier layer 430.

It should be illustrated that, for the sake of brevity, the same parts of the OLED panel 400 in FIG. 4 as the OLED panel 200 in FIG. 2 are not repeatedly described in the present application, and it should be understand by those skilled in the art that the related explanation and illustration made above in conjunction with FIG. 2 are also applicable here.

Figure 5:
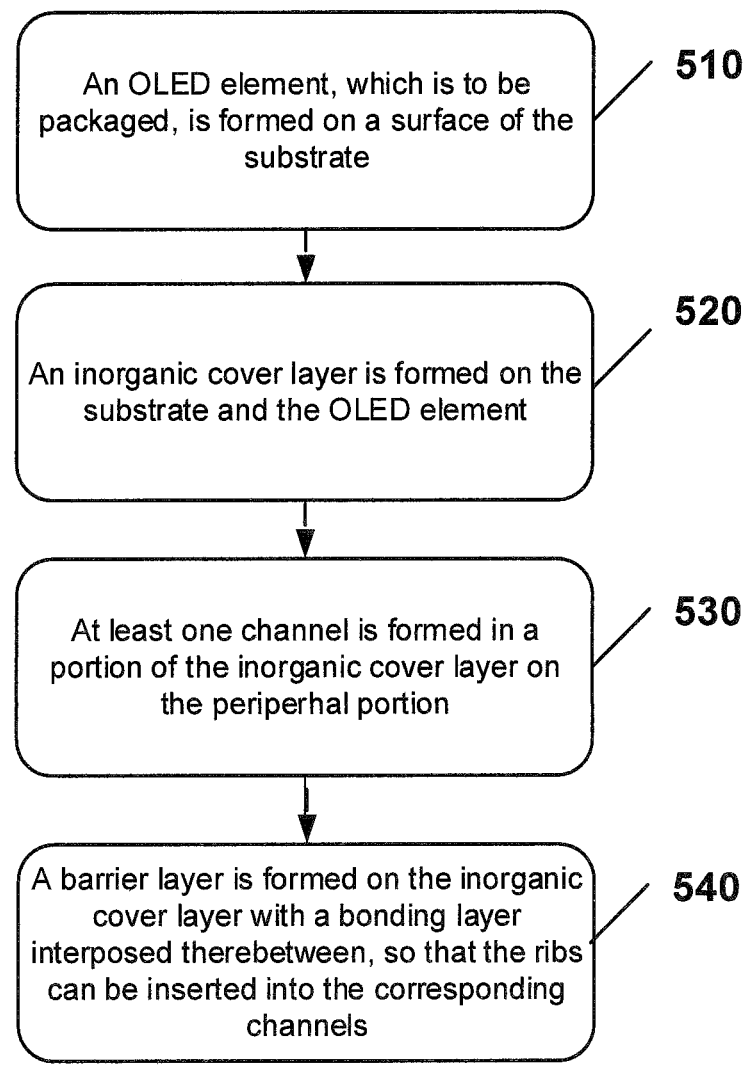
FIG. 5 illustrates a flowchart of an OLED packaging method according to another embodiment of the present disclosure.

FIG. 5 illustrates a flowchart of an OLED packaging method 500 corresponding to the OLED panel 400 shown in FIG. 4.

Firstly, in step 510, an OLED element, which is to be packaged, is formed on a surface of a substrate (for example, the substrate 410).

Then, in step 520, an inorganic cover layer (for example, the inorganic cover layer 420) is formed on the substrate and the OLED element, so that a peripheral portion of the surface is covered by the inorganic cover layer.

Next, in step 530, at least one channel is formed in a portion of the inorganic cover layer on the peripheral portion. The at least one channel corresponds to the at least one rib in the bonding layer 440, so that the at least one rib can be inserted into the corresponding channel, and an end of each of the at least one rib can be in contact with the bottom of the channels.

It should be understood that although steps 520 and 530 in the method 500 are illustrated as two separate steps, in other embodiments, they may be implemented by a single step.

Finally, in step 540, a barrier layer (for example, the barrier layer 430) is formed on the inorganic cover layer 420 with a bonding layer 440 interposed therebetween (for example, the bonding layer 440), wherein a portion of the bonding layer on the peripheral portion comprises at least one rib, which is located between the inorganic cover layer 420 and the barrier layer 430 to form an airtight space between the inorganic cover layer 420 and the barrier layer 430 for isolating the OLED element from the external.

In an embodiment, in step 540, the bonding layer 440 is firstly formed on a surface of the barrier layer 430, and then the bonding layer 440 is bonded to the inorganic cover layer 420, so that the barrier layer 430 is formed on the inorganic cover layer 420.

In another embodiment, in step 540, the bonding layer 440 may also be firstly formed on the inorganic cover layer 420, and then the barrier layer 430 is bonded to the bonding layer 440, so that the barrier layer 430 is formed on the inorganic cover layer 420.

Figure 6:
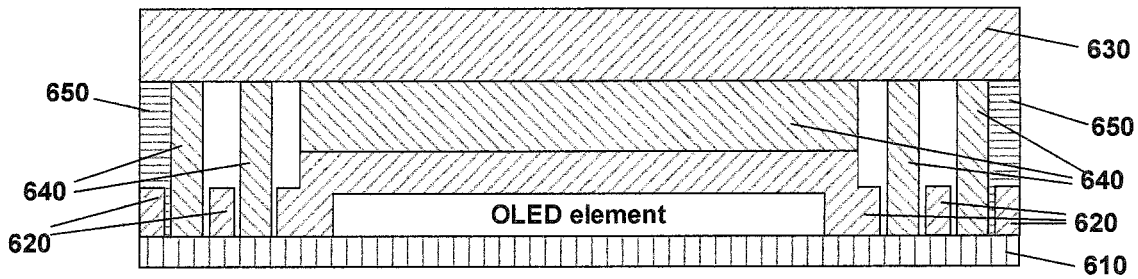
FIG. 6 illustrates an OLED panel according to yet another embodiment of the present disclosure.

FIG. 6 illustrates an OLED panel 600 according to yet another embodiment of the present disclosure.

As shown in FIG. 6, the OLED panel 600 comprises a substrate 610, an inorganic cover layer 620, a barrier layer 630, a bonding layer 640, and an edge sealant 650. The OLED panel 600 differs from the OLED panel 400 in FIG. 4 in the edge sealant 650.

As shown in FIG. 6, in the OLED panel 600, the bonding layer 640 is not located at an outer edge of the OLED panel 600 as in the OLED panel 400, and instead, a part of the inorganic cover layer 620 and the edge sealant 650 stacked thereon are located at the outer edge of the OLED panel 600, that is, the edge sealant 650 is disposed between an outer edge of the inorganic cover layer 620 and an outer edge of the barrier layer 630.

In an embodiment, the edge sealant 650 is implemented using a dispenser or an immersion gluing device.

In addition, in the embodiment shown in FIG. 6, all of the ribs 640 are formed between the substrate 610 and the barrier layer 630, but the present disclosure is not limited thereto. In fact, in some other embodiments, similarly to the embodiment shown in FIG. 2, a part of the ribs 640 may be formed between the inorganic cover layer 620 without a channel and the barrier layer 630. For example, in some embodiments, ribs 640 near the inner side may be formed between the inorganic cover layer 620 without a channel and the barrier layer 630, and ribs 640 near the outer side may be formed between the bottom of the channels of the inorganic cover layer 620 and the barrier layer 630. In some other embodiments, in a case where the channels pass through the inorganic cover layer 620, i.e., the bottom of the channels is the surface of the substrate 610, the ribs 640 near the outer side may be formed between the substrate 410 and the barrier layer 630.

It should be illustrated that, for the sake of brevity, the same parts of the OLED panel 600 in FIG. 6 as the OLED panel 400 in FIG. 4 are not repeatedly described in the present application, and it should be understand by those skilled in the art that the related explanation and illustration made above in conjunction with FIGS. 2 and 4 are also applicable here.

Figure 7:
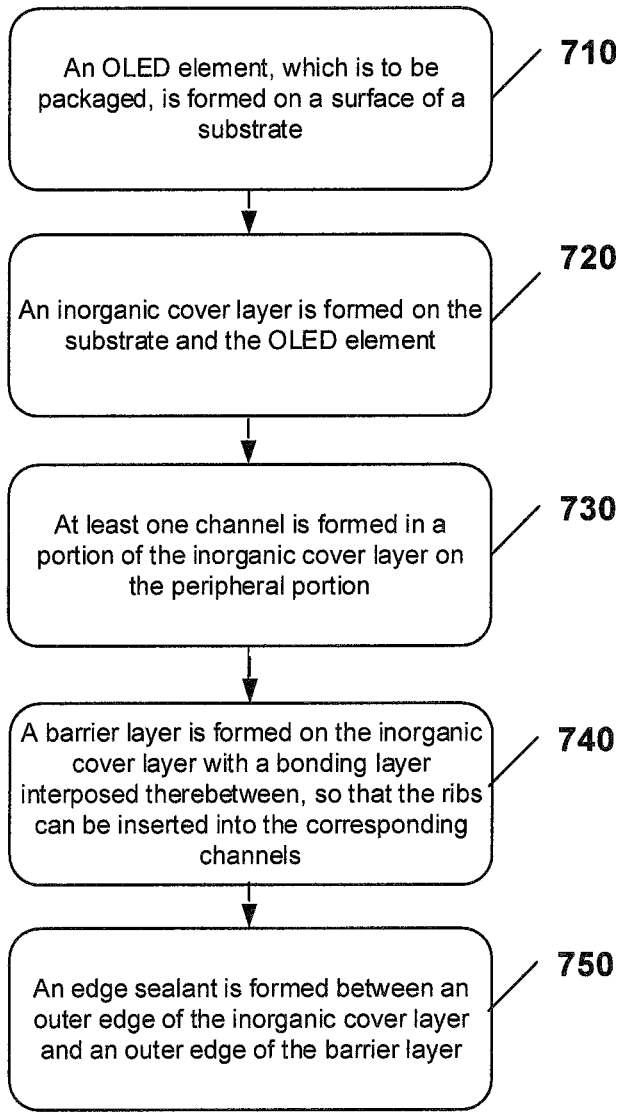
FIG. 7 illustrates a flowchart of an OLED packaging method according to yet another embodiment of the present disclosure.

FIG. 7 illustrates a flowchart of an OLED packaging method 700 corresponding to the OLED panel 600 shown in FIG. 6.

Firstly, in step 710, an OLED element, which is to be packaged, is formed on a surface of a substrate (for example, the substrate 610).

Then, in step 720, an inorganic cover layer (for example, the inorganic cover layer 620) is formed on the substrate and the OLED element, so that a peripheral portion of the surface is covered by the inorganic cover layer.

Next, in step 730, at least one channel is formed in a portion of the inorganic cover layer on the peripheral portion. The at least one channel corresponds to the at least one rib in the bonding layer 640, so that the at least one rib can be inserted into the corresponding channel, and an end of each of the at least one rib can be in contact with the bottom of the corresponding channel.

It should be understood that although steps 720 and 730 in the method 700 are illustrated as two separate steps, in other embodiments, they may be implemented by a single step.

Next, in step 740, a barrier layer (for example, the barrier layer 630) is formed on the inorganic cover layer with a bonding layer interposed therebetween (for example, the bonding layer 640), wherein a portion of the bonding layer on the peripheral portion comprises at least one rib, which is located between the inorganic cover layer and the barrier layer to form an airtight space between the inorganic cover layer and the barrier layer for isolating the OLED element from the external.

Finally, in step 750, an edge sealant (for example, the edge sealant 650) is formed between an outer edge of the inorganic cover layer and an outer edge of the barrier layer.

In an embodiment, in step 740, the bonding layer 640 is firstly formed on a surface of the barrier layer 630, and then the bonding layer 640 is bonded to the inorganic cover layer 620, so that the barrier layer 630 is formed on the inorganic cover layer 620.

In another embodiment, in step 740, the bonding layer 640 may also be firstly formed on the inorganic cover layer 620, and then the barrier layer 630 is bonded to the bonding layer 640, so that the barrier layer 630 is formed on the inorganic cover layer 620.

Although the present disclosure has been described with reference to a few exemplary embodiments, it will be understood that the terms used are illustrative and not restrictive terms. As the present disclosure can be embodied in various forms without departing from the spirit or essence of the present disclosure, it is to be understood that the above-described embodiments are not limited to any of the foregoing details but should be construed broadly within the spirit and scope defined by the appended claims. Therefore, all changes and modifications which fall within the scope of the claims or the equivalent thereof shall be covered by the appended claims.

We claim:

1. An Organic Light-Emitting Diode (OLED) panel, comprising:
    a substrate;
    an OLED element on a surface of the substrate;
    an inorganic cover layer on the substrate and the OLED element, the inorganic cover layer being configured to cover a peripheral portion of the surface of the substrate;
    a bonding layer on the inorganic cover layer; and
    a barrier layer on the bonding layer,
    wherein a portion of the bonding layer on the peripheral portion comprises at least one rib configured to form an airtight space for isolating the OLED element from the external, wherein material of the at least one rib is same as that of the bonding layer, and wherein an orthographic projection of the inorganic cover layer on the substrate is at least partly on a side of an orthographic projection of the at least one rib on the substrate that is far away from an orthographic projection of the OLED element on the substrate, wherein an orthographic projection of the inorganic cover layer on the substrate covers an orthographic projection of the OLED element on the substrate, wherein the inorganic cover layer is in contact with the substrate and not in contact with the barrier layer, wherein a portion of the inorganic cover layer on the peripheral portion has at least one channel, wherein the at least one channel corresponds to the at least one rib in the bonding layer, and the at least one rib is inserted into the corresponding channel, wherein there are inorganic cover layers on both sides of each of the least one rib.

2. The OLED panel according to claim 1, wherein the at least one rib is located between the substrate and the barrier layer.

3. The OLED panel according to claim 2, wherein an end of each of the at least one rib is in contact with the bottom of the corresponding channel.

4. The OLED panel according to claim 3, wherein the bottom of the channel is the substrate.

5. The OLED panel according to claim 1, wherein the airtight space is filled with inert gas or nitrogen gas.

6. The OLED panel according to claim 1, further comprising: an edge sealant between an edge of the inorganic cover layer and an edge of the barrier layer and outside the bonding layer.

7. The OLED panel according to claim 1, wherein the peripheral portion is a rectangular loop-shaped structure located at the periphery of the substrate.

8. A display panel comprising an OLED panel according to claim 1.

9. An Organic Light-Emitting Diode (OLED) packaging method, comprising:

forming an OLED element on a surface of a substrate;

forming an inorganic cover layer on the substrate and the OLED element, so that a peripheral portion of the surface of the substrate is covered by the inorganic cover layer; and forming a barrier layer on the inorganic cover layer with a bonding layer interposed therebetween, wherein a portion of the bonding layer on the peripheral portion comprises at least one rib configured to form an airtight space for isolating the OLED element from the external, wherein material of the at least one rib is same as that of the bonding layer, and wherein an orthographic projection of the inorganic cover layer on the substrate is at least partly on a side of an orthographic projection of the at least one rib on the substrate that is far away from an orthographic projection of the OLED element on the substrate, wherein an orthographic projection of the inorganic cover layer on the substrate covers an orthographic projection of the OLED element on the substrate, wherein the inorganic cover layer is in contact with the substrate and not in contact with the barrier layer, wherein a portion of the inorganic cover layer on the peripheral portion has at least one channel, wherein the at least one channel corresponds to the at least one rib in the bonding layer, and the at least one rib is inserted into the corresponding channel, wherein there are inorganic cover layers on both sides of each of the least one rib.

10. The OLED packaging method according to claim 9, wherein the at least one rib is formed between the substrate and the barrier layer.

11. The OLED packaging method according to claim 9, further comprising:

filling the airtight space with inert gas or nitrogen gas.

12. The OLED packaging method according to claim 9, wherein the forming of an inorganic cover layer on the substrate and the OLED element further comprises:

forming at least one channel in a portion of the inorganic cover layer on the peripheral portion, wherein the at least one channel corresponds to the at least one rib in the bonding layer, and the at least one rib is inserted into the corresponding channel, so that an end of each of the at least one rib is in contact with the bottom of the corresponding channel.

13. The OLED packaging method according to claim 12, wherein the at least one channel passes through the inorganic cover layer, so that the bottom of the at least one channel is the substrate.

14. The OLED packaging method according to claim 9, further comprising:

disposing an edge sealant between an edge of the inorganic cover layer and an edge of the barrier layer, so that the edge sealant is located outside the bonding layer.

15. The OLED packaging method according to claim 9, wherein the peripheral portion is a rectangular loop-shaped structure located at the periphery of the substrate.

16. The OLED packaging method according to claim 9, wherein the forming of a barrier layer on the inorganic cover layer with a bonding layer interposed therebetween comprises:

forming a bonding layer on a surface of the barrier layer; and bonding the bonding layer to the inorganic cover layer and/or the substrate.

* * * * *